United States Patent [19]
Owen

[11] Patent Number: 4,518,929
[45] Date of Patent: May 21, 1985

[54] FREQUENCY SYNTHESIZER HAVING OVERTONE CRYSTAL OSCILLATOR

[75] Inventor: David P. Owen, Dunstable, England

[73] Assignee: Marconi Instruments, Ltd., St. Albans, England

[21] Appl. No.: 404,474

[22] Filed: Aug. 2, 1982

[30] Foreign Application Priority Data

Aug. 4, 1981 [GB] United Kingdom ............... 8123809

[51] Int. Cl.³ .............................................. H03L 7/00
[52] U.S. Cl. ...................................... 331/11; 331/17; 331/22; 331/25; 307/526; 328/155
[58] Field of Search ................... 331/2, 10, 11, 18, 19, 331/22, 25; 328/141, 155; 307/525, 526, 529

[56] References Cited

U.S. PATENT DOCUMENTS

| | | | |
|---|---|---|---|
| 3,688,212 | 8/1972 | Hugenholtz | 331/19 X |
| 3,838,354 | 9/1974 | Hugenholtz | 331/11 X |
| 3,904,980 | 9/1975 | Hugenholtz | 331/19 X |
| 3,921,094 | 11/1975 | Schaible | 331/10 X |
| 4,186,356 | 1/1980 | Remy | 331/2 X |

FOREIGN PATENT DOCUMENTS

| | | |
|---|---|---|
| 1122299 | 8/1968 | United Kingdom . |
| 1125916 | 9/1968 | United Kingdom . |
| 1285161 | 8/1972 | United Kingdom . |
| 1442103 | 7/1976 | United Kingdom . |
| 1589046 | 5/1981 | United Kingdom . |

OTHER PUBLICATIONS

Hamer, R. C., "Microwave-Frequency Synthetisers", Electronics Letters, v. 5, No. 7, pp. 156–157, (Apr. 3, 69).
Thompson, R., "Frequency Synthesizer-4", Wireless World, (Mar. 79), pp. 83–85.
McAllister, P. A., "Phase-Lock Techniques for Synthesis of Microwave Frequencies", IEEE Proc., v. 127, pt. H, No. 2, pp. 112–115, (Apr. 80).

Primary Examiner—Eugene R. LaRoche
Assistant Examiner—Robert J. Pascal
Attorney, Agent, or Firm—Spencer & Frank

[57] ABSTRACT

A frequency synthesizer which is capable of providing very high output frequencies of the order of 500 MHz is designed to produce a very pure signal having very low noise. An overtone crystal oscillator which is constrained to oscillate at a harmonic frequency of the fundamental frequency determined by the physical dimensions of the crystal is mixed with a variable low frequency signal which is varied to provide the necessary output frequency steps. It is not possible to adjust the frequency of the overtone crystal oscillator without degrading its stability and introducing noise, and any departure of the frequency to the overtone crystal oscillator from its nominal value is compensated by adjusting the low frequency oscillator.

8 Claims, 1 Drawing Figure

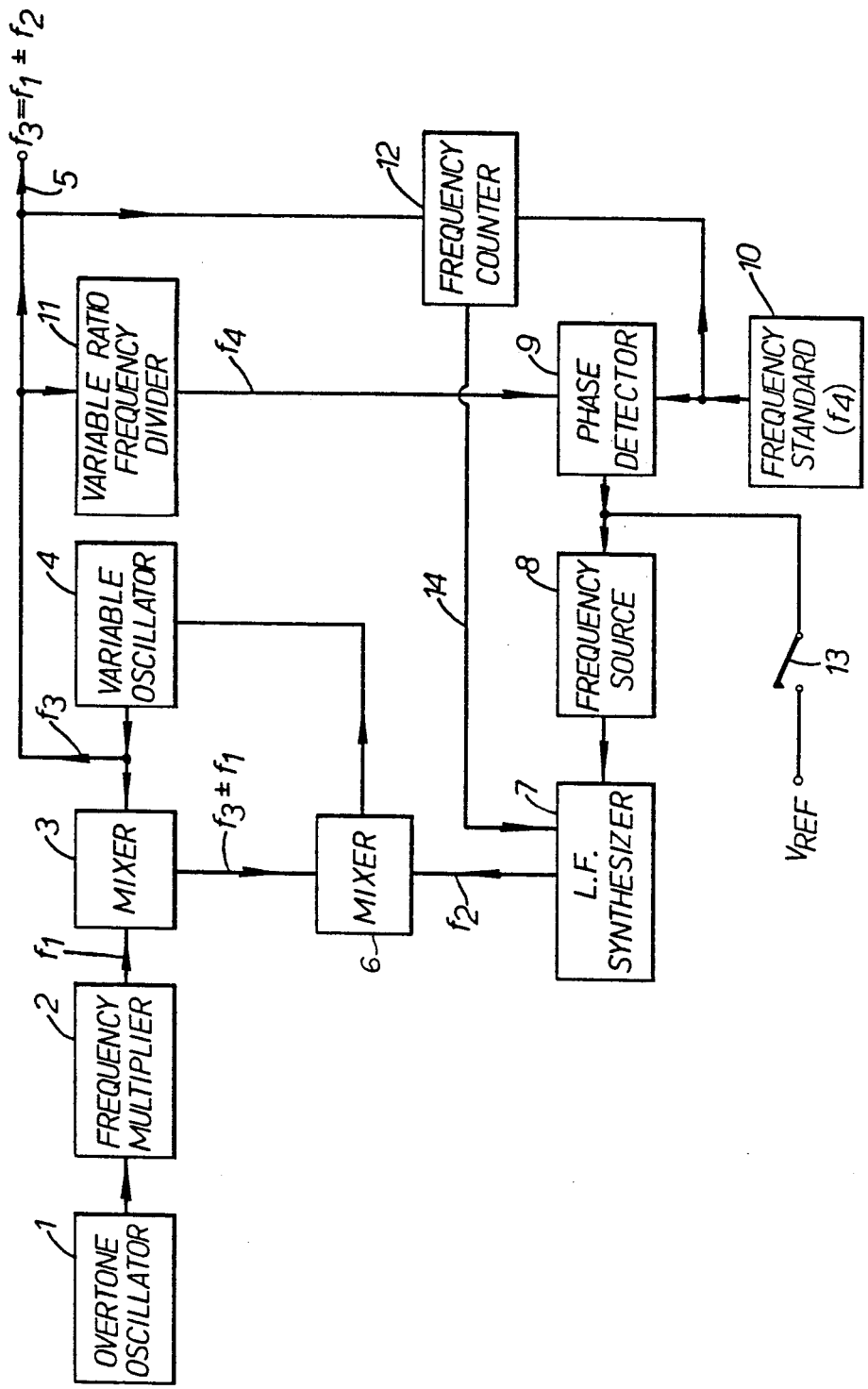

FREQUENCY SYNTHESIZER HAVING OVERTONE CRYSTAL OSCILLATOR

BACKGROUND OF THE INVENTION

This invention relates to frequency synthesizers and is specifically concerned with synthesizers which produce only a very low level of unwanted noise in addition to a required output signal at a specified frequency. The output frequency of a frequency synthesizer is never completely pure, but possesses frequency modulation noise side bands which stem from the way the output frequency is synthesized and from the nature of the standard frequency source which is used by the synthesizer as a frequency reference. A standard frequency source commonly takes the form of a very stable crystal oscillator, and although such an oscillator generates a certain amount of noise, it is at a low level and is often acceptable. It is impracticable to produce a crystal oscillator which is capable of supporting a fundamental mode of oscillation at frequencies greatly in excess of a few tens of megahertz because the physical dimensions of the crystal cannot be reduced below a level at which it can be readily and reliably manufactured.

Thus the need for a frequency synthesizer which is able to operate at very much higher frequencies, e.g. of the order of several hundred megahertz, has been satisfied by multiplying the output frequency of the crystal oscillator by an appropriate factor. This process inevitably worsens the noise to a very great extent. For example, while a 10 MHz crystal oscillator can exhibit a very acceptable single side band noise figure of $-170$ dB/hertz at a given off-set frequency, the effect of multiplying the frequency by a factor of 50 results inevitably in a noise figure of $-134$ dB even if no additional sources of noise are introduced.

SUMMARY OF THE INVENTION

The present invention seeks to provide an improved frequency synthesizer which is capable of providing a very low noise figure.

According to this invention, a frequency synthesizer includes an overtone crystal oscillator arranged to produce a first frequency; a variable frequency source arranged to produce a second frequency which is lower than the first frequency; means for combining the first and second frequencies to produce a required output signal at a third frequency; and means for adjusting the value of said second frequency to compensate for departures of the first frequency from a nominal value.

By the term overtone crystal oscillator is meant a crystal constrained to oscillate at a harmonic multiple of its fundamental frequency of oscillation. Since the natural frequency of oscillation of the crystal is a function of its mechanical properties, the electrical frequency of the overtone crystal will not in general be an exact integral multiple of the electrical fundamental frequency. The nominal frequency of a crystal oscillator operating in its fundamental mode can be readily adjusted over a usefully wide frequency band by altering the electrical properties of its tuned circuit, and it is generally necessary to do so to compensate for minor discrepancies from its nominal frequency which stem from mechanical discrepancies within a batch of crystals, and to compensate for temperature changes and ageing characteristics which occur during its lifetime. However it is not possible to similarly adjust the frequency of an overtone crystal oscillator to a significant extent in a low noise application, since to do so seriously reduces its Q factor and degrades its frequency stability.

In a frequency synthesizer, it is often necessary to provide a relatively low frequency signal source (and this can typically be a frequency synthesizer in its own right) coupled to a crystal oscillator to enable the output frequency to be exactly set to any required value. The invention uses a low frequency signal source to avoid the need to pull the actual output frequency of the overtone oscillator to its nominal or design value. Since the noise requirements of a low frequency oscillator can readily be made using standard and well known techniques, it is possible to produce a frequency synthesiser capable of operating at a very high carrier frequency value while providing a very pure and noise free output signal. If the frequency synthesizer is required to cover a very wide range of high frequencies, a number of selectable overtone crystal oscillators can be used so that the one most appropriate to the required output frequency can be switchably selected as needed.

It may be necessary to multiply the output frequency of the overtone crystal oscillator by a small factor if a very high output frequency is wanted, but as only a very small factor will generally be required, the increase in noise level is acceptable, particularly as in the present invention the multiplier can be designed with a minimum noise requirement in mind rather than to ensure that it has a truly linear characteristic.

BRIEF DESCRIPTION OF THE DRAWING

The sole FIGURE is a schematic block diagram, which illustrates a frequency synthesizer utilizing an overtone crystal oscillator.

DESCRIPTION OF THE PREFERRED EMBODIMENT

Referring to the drawing, an oscillator 1 takes the form of an overtone crystal oscillator which uses a quartz crystal which is dimensioned to be capable in principle of supporting a fundamental mode of oscillation in the frequency range 10 to 25 MHz. The tuned circuit which forms part of the oscillator 1, and which is not separately shown, is such as to constrain the oscillator to operate not in its fundamental mode, but at its fifth harmonic so that the oscillator provides an output frequency which is nominally 120 MHz. It is from such a mode of operation that the oscillator takes the term "overtone crystal oscillator". The frequency synthesizer is designed to provide an output frequency of the order of 500 MHz, which can be adjusted in 1 Hz steps to any required value within a range determined by the frequency of the overtone crystal oscillators and the frequency range of a low frequency synthesizer 7.

The output of the oscillator 1 is fed via a frequency multiplier 2 which has a multiplication factor of four, to a mixer 3 where it is mixed with the output of a variable frequency oscillator 4 which is controlled so as to provide the required output frequency of the frequency synthesizer at an output terminal 5. The frequency of oscillation of the oscillator 4 is controlled by means of a phase lock loop which includes the mixer 3 and a further mixer 6. A second input to the mixer 6 is obtained from the low frequency synthesizer 7, which is able to provide any desired frequency to an accuracy of 1 Hz over a relatively limited frequency band. A subsidiary standard frequency source 8 is used as a reference frequency for the low frequency synthesizer 7, and the value of the frequency source 8 is itself controlled by the output of a phase detector 9 which is operative to compare the output frequency present at terminal 5 with a frequency standard 10. A variable frequency divider 11 divides down the output frequency present at terminal 5 so that it has nominally the same value as the frequency standard from the source 10. Any disagreement causes the phase detector to output a correction signal which adjusts the frequency of the frequency source 8 to compensate.

The oscillator 4 is phase locked to provide an output frequency $f_3$ which is equal to $f_1 \pm f_2$, where $f_1$ is the output frequency of the frequency multiplier 2 and $f_2$ is the output frequency of the low frequency synthesizer 7. Although the frequency $f_3$ will exhibit a very low noise level, it may not have exactly its nominal value, since the frequency $f_1$ may not have its design value. As previously explained, it is not possible to adjust the output frequency of oscillator 1 to compensate for any errors, since to do so would degrade its stability and introduce the noise which the invention seeks to remove. The errors in the frequency $f_3$ are instead removed by adjusting the output frequency $f_2$ of the low frequency synthesizer 7 to compensate. The actual output frequency $f_3$ is therefore divided by the variable ratio frequency divider 11 whose division ratio is set in accordance with the required value of the output frequency $f_3$ and the known value of the standard frequency $f_4$. If the frequency $f_3$ does not have its required value, i.e. if frequency $f_3$ when divided by the division factor of divider 11 does not exactly equal the frequency $f_4$ generated by the frequency standard 10, an error signal is produced by the phase detector 9 and is operative to adjust the frequency of the frequency source 8 in such a sense as to remove the error.

Although in the drawing, the frequency $f_2$ is generated by the low frequency synthesizer 7 and the frequency source 8, they may instead be replaced by a voltage controlled oscillator, which receives the output of the phase detector 9 as a control signal which determines its frequency of oscillation. Generally, however, the use of the arrangement illustrated will enable a lower noise figure to be obtained. Typically, the phase locked loop which includes the phase detector 9 will have a fairly narrow loop bandwidth in order to avoid introducing additional noise into the system. Therefore it is desirable to minimize phase jitter which might be introduced by the variable ratio frequency divider 11 and it is desirable to employ a divider of the kind which is capable of providing fractional frequency division—such a device is commonly termed a fractional-N divider.

A frequency counter 12 and a switch 13 are optionally provided to allow for the possibility that the departure of frequency $f_1$ from its nominal value is so large that it cannot be satisfactorily corrected by pulling the frequency of the subsidiary standard frequency source 8 sufficiently far from its own nominal value. During the setting up of the circuit, the switch 13 is rendered conductive so that a reference voltage level $V_{REF}$ is applied to the subsidiary standard frequency source 8. This voltage reference is chosen so that it represents the control voltage which is required to operate the frequency source 8 at its nominal operating frequency (which generally lies at the center of the frequency band over which it is possible to tune the frequency source 8). Under these conditions, the frequency counter 12 measures the output frequency $f_3$ so that the error in $f_3$ from its required value can be determined. The output frequency of the low frequency synthesizer 7 is then set over line 14 to compensate for this error and to force the output frequency to exactly the required value of $f_3$. The switch 13 is then opened so that the phase locked loop can operate to remove any residual errors which arise in the output frequency $f_3$ and to compensate for any drifts which occur in the various components which make up the frequency synthesizer. Any frequency drift which does occur during normal operation is likely to be very much less than the extent to which the frequency $f_1$ initially departed from its nominal value determined by the overtone crystal oscillator so that the frequency of the frequency source 8 has to be adjusted by only a relatively small amount which is well within its capabilities.

The frequency counter 12 can also be used as a means of controlling the oscillator 4 to ensure that it phase locks to either $f_1 + f_2$ or $f_1 - f_2$ as required. If the counter indicates that the oscillator 4 has failed to lock to approximately the required frequency then the control system can correct the setting of the oscillator 4 such as to ensure that it can be locked to the required frequency.

I claim:

1. A frequency synthesizer including an overtone; crystal oscillator arranged to produce a first frequency; a variable frequency source arranged to produce a second frequency which is lower than said first frequency; means for combining the first and second frequencies to produce a required output signal at a third frequency; and means for adjusting the value of said second frequency to compensate for departures of the first frequency from a nominal value causing variations in said third frequency, wherein said combining means comprises an output oscillator for generating said third frequency and means for mixing said first frequency with said third frequency to generate a frequency which is nominally equal to said second frequency, any difference between said second frequency and said frequency which is nominally equal to said second frequency being used to adjust the frequency of oscillation of said output oscillator.

2. A frequency synthesizer as claimed in claim 1 and wherein the frequency of oscillation of said variable frequency source is controlled by said means for adjusting in dependence on the value of the third frequency to compensate for said departures of said first frequency from its nominal value.

3. A frequency synthesizer as claimed in claim 1 and wherein said overtone crystal oscillator comprises a reference oscillator producing overtone frequencies supplied to a frequency multiplier to produce said first frequency.

4. A frequency synthesizer including an overtone crystal oscillator arranged to produce a first frequency; a variable frequency source arranged to produce a second frequency which is lower than the first frequency; means for combining the first and second frequencies to produce a required output signal at a third frequency; a reference frequency source having a predetermined frequency value; means for determining whether said third frequency and said predetermined frequency values have a required relationship; and means for adjusting the value of said second frequency in dependence on departures from said relationship to compensate for departures of the first frequency from a nominal value, causing variations in said third frequency.

5. A frequency synthesizer as claimed in claim 4 and wherein said means for determining whether said third frequency and said predetermined frequency values have a required relationship comprises a variable ratio frequency divider which receives said third frequency, and a phase detector which is connected to said variable ratio frequency divider and which receives said predetermined frequency.

6. A frequency synthesizer as claimed in claim 4 or 5, and wherein said overtone crystal oscillator comprises a reference oscillator producing overtone frequencies supplied to a frequency multiplier to produce said first frequency.

7. A frequency synthesizer including an overtone crystal oscillator arranged to produce a first frequency; a variable frequency source arranged to produce a second frequency which is lower than the first frequency; means for combining the first and second frequencies to produce a required output signal at a third frequency; a reference frequency source having a predetermined frequency value; means for determining whether said third frequency and said predetermined frequency values have a required relationship; and means for adjusting the value of said second frequency in dependence on departures from said relationship to compensate for departures of the first frequency from a nominal value, causing variations in said third frequency, wherein said combining means comprises an output oscillator for generating said third frequency and means for mixing said first frequency with said third frequency to generate a frequency which is nominally equal to said second frequency, any difference between said second frequency and said frequency which is nominally equal to said second frequency being used to adjust the frequency of oscillation of said output oscillator.

8. A frequency synthesizer as claimed in claim 7 and wherein said overtone crystal oscillator comprises a reference oscillator producing overtone frequencies supplied to a frequency multiplier to produce said first frequency.

* * * * *